US008941188B2

(12) United States Patent
Willmeroth et al.

(10) Patent No.: US 8,941,188 B2
(45) Date of Patent: Jan. 27, 2015

(54) SEMICONDUCTOR ARRANGEMENT WITH A SUPERJUNCTION TRANSISTOR AND A FURTHER DEVICE INTEGRATED IN A COMMON SEMICONDUCTOR BODY

(75) Inventors: Armin Willmeroth, Augsburg (DE); Franz Hirler, Isen (DE); Peter Irsigler, Obernberg/Inn (AT)

(73) Assignee: Infineon Technologies Austria AG, Villach (AT)

( * ) Notice: Subject to any disclaimer, the term of this patent is extended or adjusted under 35 U.S.C. 154(b) by 113 days.

(21) Appl. No.: 13/429,568

(22) Filed: Mar. 26, 2012

(65) Prior Publication Data

US 2013/0249001 A1 Sep. 26, 2013

(51) Int. Cl.
*H01L 27/088* (2006.01)
*H01L 21/336* (2006.01)
(Continued)

(52) U.S. Cl.
CPC ............ *H01L 29/78* (2013.01); *H01L 29/88* (2013.01); *H01L 29/732* (2013.01); *H01L 29/7395* (2013.01); *H01L 29/7788* (2013.01); *H01L 29/7926* (2013.01); *H01L 21/823487* (2013.01); *H01L 27/0828* (2013.01); *H01L 27/10864* (2013.01); *H01L 27/0826* (2013.01); *H01L 27/10841* (2013.01)
USPC ......................................... 257/401; 438/197

(58) Field of Classification Search
CPC ............ H01L 29/7393; H01L 29/7395; H01L 2924/13055; H01L 29/66325; H01L 29/7802; H01L 29/1095; H01L 29/0696; H01L 21/823487; H01L 21/823885; H01L 27/0821; H01L 27/0828; H01L 27/10864; H01L 29/66272; H01L 29/66666; H01L 29/66909; H01L 29/732; H01L 29/7371; H01L 29/7788; H01L 29/7827; H01L 29/78642

USPC .................. 257/E29.027–E29.028, 257/E29.066–E29.067, E29.194–E29.202, 257/E21.382–E21.385, E21.608–E21.613, 257/213–413, 900, 902–903, 142, 257/E21.19–E21.21, E21.394–E21.458, 257/E21.615–E21.694, E29.255–E29.313, 257/E29.315–E29.316, 135, 151, 197, 199, 257/201, 207, E21.409–E21.449, 210–211, 257/503, 508, E33.062–E33.066, 257/E31.124–E31.126, E51.019, 98, 100, 257/584–688; 438/201, 202, 137, 197, 200, 438/204, 206, 207, 211, 192, 209
See application file for complete search history.

(56) References Cited

U.S. PATENT DOCUMENTS

| | | | | |
|---|---|---|---|---|
| 6,107,142 | A * | 8/2000 | Suvorov et al. | 438/285 |
| 2006/0033153 | A1 * | 2/2006 | Onishi et al. | 257/328 |
| 2006/0071237 | A1 * | 4/2006 | Deboy et al. | 257/133 |

*Primary Examiner* — Colleen A Matthews
*Assistant Examiner* — Junaiden Mirsalahuddin
(74) *Attorney, Agent, or Firm* — Murphy, Bilak & Homiller, PLLC

(57) ABSTRACT

A semiconductor arrangement includes a semiconductor body and a power transistor arranged in a first device region of the semiconductor body. The power transistor includes at least one source region, a drain region, and at least one body region, at least one drift region of a first doping type and at least one compensation region of a second doping complementary to the first doping type, and a gate electrode arranged adjacent to the at least one body region and dielectrically insulated from the body region by a gate dielectric. The semiconductor arrangement also includes a further semiconductor device arranged in a second device region of the semiconductor body. The second device region includes a well-like structure of the second doping type surrounding a first semiconductor region of the first doping type. The further semiconductor device includes device regions arranged in the first semiconductor region.

20 Claims, 7 Drawing Sheets

(51) Int. Cl.
*H01L 29/78* (2006.01)
*H01L 29/88* (2006.01)
*H01L 29/732* (2006.01)
*H01L 29/739* (2006.01)
*H01L 29/778* (2006.01)
*H01L 29/792* (2006.01)
*H01L 21/8234* (2006.01)
*H01L 27/082* (2006.01)
*H01L 27/108* (2006.01)

SEMICONDUCTOR ARRANGEMENT WITH A SUPERJUNCTION TRANSISTOR AND A FURTHER DEVICE INTEGRATED IN A COMMON SEMICONDUCTOR BODY

TECHNICAL FIELD

Embodiments of the present invention relate to a semiconductor arrangement, in particular a semiconductor arrangement with a power transistor and a further semiconductor device integrated in a common semiconductor body.

BACKGROUND

Power transistors, such as power MOSFETs or power IGBTs, are widely used as electronic switches for switching electric loads, such as motors, actors, lamps, or the like. In many applications, load paths of two power transistors are connected in series between terminals for positive and negative supply potentials so as to form a half-bridge circuit, where the load is coupled to an output of the half-bridge. In a half-bridge circuit the transistor connected between output and a terminal for a negative supply potential is referred to as low-side transistor (low side switch), while the transistor connected between a terminal for the positive supply potential and the output is referred to as high-side transistor (high-side switch).

A power transistor is a voltage controlled device that can be controlled by a drive signal (drive voltage) received by a control terminal, which in a MOSFET or an IGBT is a gate terminal. While the low-side transistor can be controlled using a drive signal that is referenced to the negative supply potential, driving the high-side transistor requires a drive signal that is either referenced to the positive supply potential or to the electrical potential at the output terminal, where the electrical potential at the output terminal may vary between the negative supply potential and the positive supply potential, dependent on the switching state of the half-bridge. For driving the high-side transistor and the low-side transistor it is desirable to use a control circuit that generates control signals referenced to the negative supply potential. While the control signal for the low-side switch may be directly used for driving the low-side transistor, a level shifter may be required for shifting a signal level of the control signal for the high-side transistor to a suitable signal level for driving the high-side transistor or to a signal level suitable to be processed by a drive circuit for the high-side transistor.

A level shifter, however, may require a further power device, such as a further transistor, that has a voltage blocking capability similar to the voltage blocking capability of the low-side transistor.

Superjunction transistors are a specific type of power transistor that include at least one drift region of one conductivity type and at least one compensation region of an opposite conductivity type adjoining the at least one drift region.

In order to reduce manufacturing costs and to reduce the size there is a need to implement a power transistor, such as a superjunction transistor, and a further device in a common semiconductor body.

SUMMARY

A first embodiment relates to a semiconductor arrangement. The semiconductor arrangement includes a semiconductor body, a power transistor arranged in a first device region of the semiconductor body, and a further semiconductor device arranged in a second device region of the semiconductor body. The power transistor includes at least one source region, a drain region, and at least one body region, at least one drift region of a first doping type and at least one compensation region of a second doping complementary to the first doping type, and a gate electrode arranged adjacent to the at least one body region and dielectrically insulated from the body region by a gate dielectric. The second device region includes a well-like structure of the second doping type surrounding a first semiconductor region of the first doping type. The further semiconductor device includes device regions arranged in the first semiconductor region.

A second embodiment relates to a half-bridge circuit, including a low-side transistor and a high-side transistor each comprising a load path and a control terminal, a high-side drive circuit comprising a level shifter with a level shifter transistor, wherein the low-side transistor and the level shifter transistor are integrated in a common semiconductor body.

Those skilled in the art will recognize additional features and advantages upon reading the following detailed description, and upon viewing the accompanying drawings.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION

In the following Detailed Description, reference is made to the accompanying drawings, which form a part thereof, and in which is shown by way of illustration specific embodiments in which the invention may be practiced. In this regard, directional terminology, such as "top", "bottom", "front", "back", "leading", "trailing" etc., is used with reference to the orientation of the FIGs. being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1:
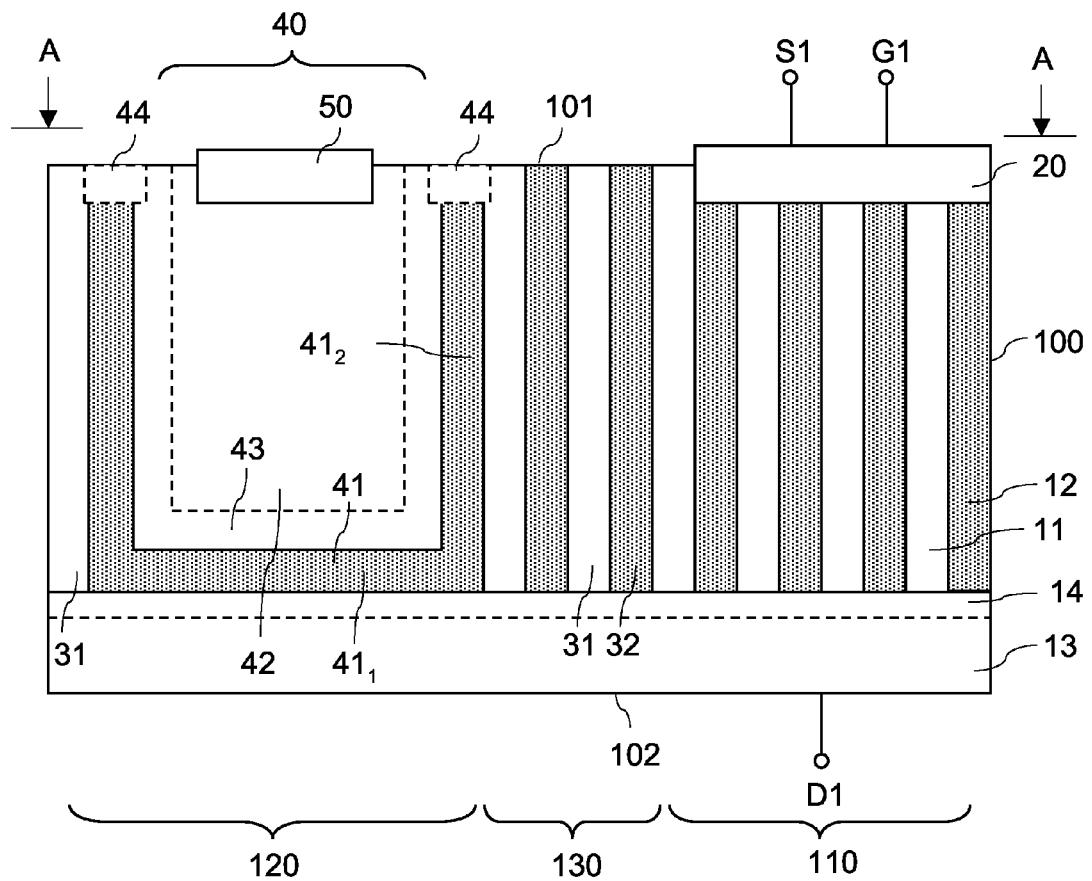
FIG. 1 illustrates a vertical cross sectional view of a semiconductor arrangement including a power transistor implemented in a first device region of a semiconductor body and a further semiconductor device implemented in a second device region of the semiconductor body.

FIG. 1 illustrates a vertical cross sectional view of a semiconductor arrangement including a semiconductor body 100 and active regions of a power transistor and a further semiconductor device implemented in the semiconductor body 100. FIG. 1 shows a vertical cross sectional view of the semiconductor body 100, which is a cross sectional view in a vertical section plane that extends perpendicular to a first surface 101 and an opposite second surface 102 of the semiconductor body 100.

The semiconductor body 100 includes a first device region 110 in which active regions of a power transistor are implemented, and a second device region 120 in which a further semiconductor device 50 is implemented. The power transistor is implemented as a superjunction transistor and includes at least one drift region 11 of a first doping type and at least one compensation region 12 of a second doping type complementary to the first doping type. The power transistor illustrated in FIG. 1 includes a plurality of drift regions 11 and a plurality of compensation regions 12, where the drift regions 11 and the compensation regions 12 are arranged alternately in a lateral direction of the semiconductor body 100. Further, the power transistor is a vertical transistor, which means that a main current flow direction in the power transistor corresponds to a vertical direction of the semiconductor body 100. Thus, the drift region 11 and the compensation regions 12 extend in the vertical direction of the semiconductor body 100.

The power transistor further includes a drain region 13 that is connected to a drain terminal D1 (that is only schematically illustrated) and a source region arranged distant to the drain region 13 in the vertical direction of the semiconductor body 100. The source region is not explicitly shown in FIG. 1. The source region is part of a control structure 20 of the power transistor, where this control structure 20 is only schematically shown in FIG. 1 and will be explained in further detail below. The control structure 20 is arranged in a region of the first surface 101 of the semiconductor body 100, while the drain region 13 is arranged in the region of the second surface 102 of the semiconductor body 100.

According to one embodiment, the semiconductor body 100 includes a first semiconductor layer or a semiconductor substrate that forms the drain region 13 and that forms the second surface 102 of the semiconductor body 100. In this case, the semiconductor body 100 includes at least one second semiconductor layer arranged above the first layer or substrate and including the drift regions 11, the compensation regions 12 and the active semiconductor regions of the control structure 20. The at least one second layer can be an epitaxial layer that includes a plurality of sub-layers that are produced in subsequent method steps.

In FIG. 1, reference character S1 denotes a source terminal of the power transistor, and reference character G1 denotes a gate terminal of the power transistor. Examples of the control structure of the power transistor will be explained with reference to FIGS. 5 and 6 below.

Referring to FIG. 1, the second device region 120 includes a well-like semiconductor structure 41 of the second doping type, which is the doping type of the compensation regions 12 in the first device region 110. The well-like semiconductor structure 41, which will be referred to simply as "well" in the following, includes a bottom section $41_1$ extending in a horizontal plane of the semiconductor body 100, and sidewall sections $41_2$ extending from the bottom section $41_1$, which is arranged distant to the first surface 101, to the first surface 101. In the embodiment illustrated in FIG. 1, the bottom section $41_1$ essentially extends in a horizontal plane of the semiconductor body 100. However, this is only an example. The bottom section $41_1$ could also be curved, like a bowl. Although, the sidewall sections $41_2$ of the well 41 essentially extend in a vertical direction of the semiconductor body 100 in the embodiment of FIG. 1, this is only an example. The sidewall sections $41_2$ could also extend in a direction that is different from the vertical direction to the first surface 101.

Optionally, the well includes a higher doped region 44 in the region of the second surface 101. "Higher doped" in this connection means that the semiconductor region 44 has a higher doping concentration than the remaining sections of the well. The higher doped region 44 is also of the second doping type. In the embodiment illustrated in FIG. 1, the higher doped region 44 extends to the first surface 101. The well-like structure 41 and, therefore the higher doped region 44, may be floating or may be connected to a defined electrical potential, such as the electrical potential at a terminal of a semiconductor device implemented in the well 41. The implementation of devices in the well 41 is explained below. According to one embodiment explained below, a transistor having a drain terminal D2 is implemented in the well 41. In this case, the well 41 and/or the higher doped region 44 may be connected to the drain terminal D2. When the optional higher doped region 44 is omitted, the sidewalls $41_2$ of the well 41 may extend to the first surface 101.

The well 41 of the second doping type encloses or surrounds a first semiconductor region 42 of the first doping type, which is the doping type of the drift region 11 in the first device region 110. In this first semiconductor region 42 active device regions of a further semiconductor device 50 are implemented. This further semiconductor device 50 is only schematically illustrated in FIG. 1. Embodiments of this further semiconductor device 50 will be explained with reference to FIGS. 7 to 10 below.

The semiconductor device 50 may be a high voltage device, which is a semiconductor device with a voltage blocking capability of several 10V or even several 100V, dependent on the specific implementation. The voltage blocking capability of the high voltage device may correspond to the voltage blocking capability of the power device. However, the high voltage device may be implemented to have a much lower current bearing capability or a much higher on-resistance than the power transistor.

Optionally, a second semiconductor region 43 of the first doping type is arranged between the well 41 and the first semiconductor region 42. In the embodiment illustrated in FIG. 1, this second semiconductor region 43 adjoins the well 41 and extends along the bottom section $41_1$ and the sidewall sections $41_2$ of the well 41. According to a further embodiment, the second semiconductor region 43 only extends only along the bottom section $41_1$ of the well 41.

The doping concentration of the well 41 may correspond to the doping concentration of the compensation regions 12. The doping concentration of these compensation regions 12 is, for example, in the range of between $10^{13}$ cm$^{-3}$ and $10^{17}$ cm$^{-3}$. The doping concentration of the second semiconductor region 43 may correspond to the doping concentration of the drift regions 11, where the doping concentration of the drift regions 11 may correspond to the doping concentration of the compensation regions 12. The doping concentration of the first semiconductor region 42 is lower than the doping concentration of the second semiconductor region 43. For example, the doping concentration of the second semiconductor region 43 is between intrinsic and $2 \cdot 10^{14}$ cm$^{-3}$ or between $10^{13}$ cm$^{-3}$ and $2 \cdot 10^{14}$ cm$^{-3}$.

The drift regions 11 and the compensation regions 12 can be produced using conventional method steps for producing the drift regions and compensation regions of a superjunction transistor. The well 41, the optional second semiconductor region 43 and the first semiconductor region 41 can be produced together with the drift regions 11 and the compensation regions 12 in the same method steps. This will be explained in the following. The method for producing the drift regions 11, the compensation regions 12, the well 41, the optional second semiconductor region 43 and the first semiconductor region 42 includes epitaxially growing a plurality of epitaxial layers on a semiconductor substrate that forms the drain region 13. These epitaxial layers form the sub-layers of the second semiconductor layer explained before. According to one embodiment, the individual epitaxial layers are grown with a basic doping concentration of the first doping type. In order to form the drift regions 11 and the compensation regions 12 dopant atoms are implanted into the individual epitaxial layers, where in each epitaxial layer sections of the individual drift regions 11 and sections of the individual compensation regions 12 are formed. The well 41 can be formed in an equivalent manner, by implanting dopant atoms into the individual epitaxial layers at those positions at which sections of the well 41 are to be formed. According to one embodiment, the bottom section $41_1$ of the well 41 is formed in one epitaxial layer, wherein the sidewall sections $41_2$ have a plurality of sections arranged one above another and each formed in one epitaxial layer. The optional second semiconductor region 43 can be formed in the same way as the well 41. A bottom section of the second semiconductor region 43, which is a section adjoining the bottom section $41_1$ of the well 41, is, for example, formed in an epitaxial layer that is produced immediately after the epitaxial layer in which the bottom section $41_1$ of the well 41 is formed.

The doping concentration of the first semiconductor region 42 may correspond to the basic doping of the epitaxial layers. In this case, the first semiconductor region 42 is formed by those regions of the individual epitaxial layers in which no additional dopant atoms are implanted.

The bottom section $41_1$ of the well 41 can be formed in a first epitaxial layer grown on the substrate forming the drain region 13. In this case, the well 41 adjoins the drain region 13.

The compensation regions 12 may adjoin the drain region 13. In this case, sections of the compensation regions 13 are already formed in the first epitaxial layer grown on the substrate. According to a further embodiment, the compensation regions 12 are distant to the drain region 13 in the vertical direction of the semiconductor body 100. In this case, sections of the compensation regions 12 are, for example, formed in the second epitaxial layer for the first time. Optionally, a semiconductor region 14 of the first doping type is arranged between the compensation region 32 and the drain region 13, so as to separate the compensation regions 32 from the drain region 13. The doping concentration of this semiconductor region 14 may correspond to the doping concentration of the drift region 31 or may be slightly lower (such as between 0 and 5% or between 0 and 10% lower) or slightly higher (such as between 0 and 5% or between 0 and 10% higher). Referring to FIG. 1, the semiconductor region 14 may be implemented as a horizontal semiconductor layer which is also arranged between the drift region 31 and the drain region 13 and the well 41 and the drain region 13.

Referring to FIG. 1, the second device region 120 is arranged distant to the first device region 110 in a lateral direction of the semiconductor body 100. An intermediate region 130 is formed between the first device region 110 and the second device region 120. The intermediate region 130 can be considered as edge region of the power transistor and includes first edge regions 31 of the first doping type and second edge regions 32 of the second doping type, wherein each first edge region 31 adjoins at least one second edge region 32. The doping concentrations of the first edge regions 31 may correspond to the doping concentrations of the drift regions 11, and the doping concentrations of the second edge regions 32 may correspond to the doping concentrations of the compensation regions 12. The edge regions 31, 32 can be formed by the same method steps as the drift region 11 and the compensation regions 12 as well as the well 41, the optional second semiconductor region 43 and the first semiconductor region 42. Like the drift regions 11 and the compensation regions 12, the first and second edge regions 31, 32 extend in a vertical direction of the semiconductor body 100. In the embodiment illustrated in FIG. 1, these edge regions 31, 32 extend to the first surface 101 of the semiconductor body 100. In the vertical direction the edge regions 31, 32 may extend as deep into the semiconductor body 100 as the drift regions 11 and the compensation regions 12.

Figure 2:
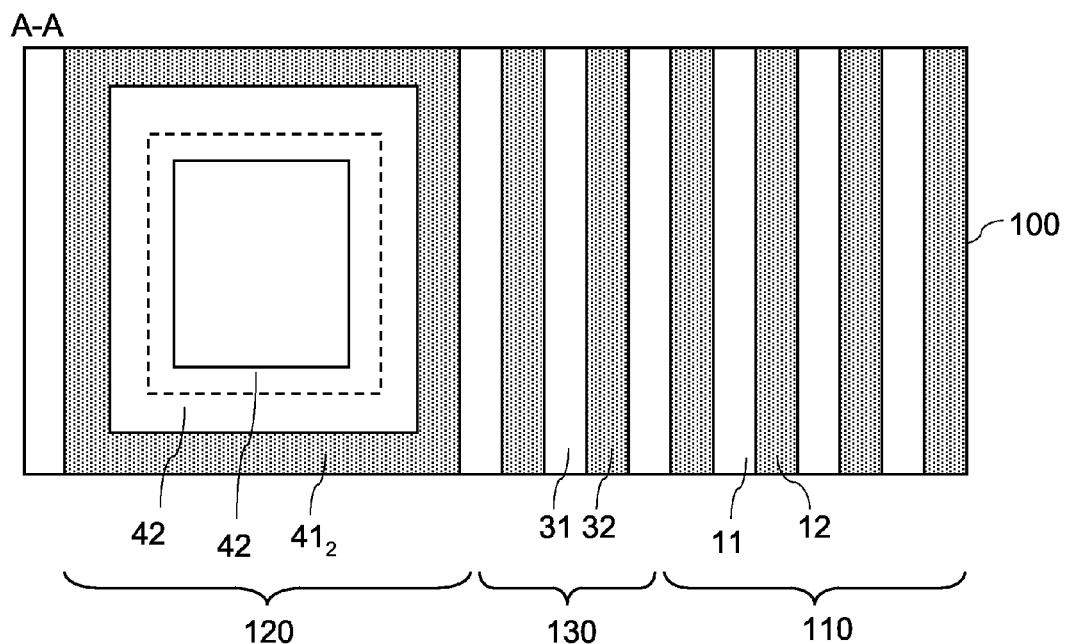
FIG. 2 illustrates a horizontal cross sectional view of the semiconductor arrangement of FIG. 1.

FIG. 2 illustrates a horizontal cross sectional view of the semiconductor body 100. In the embodiment illustrated in FIG. 2, the drift regions 11 and the compensation regions 12 have a stripe-like (elongated) or wall-like geometry, which means that they extend longitudinally in a lateral direction of the semiconductor body 100. Like the drift regions 11 and the compensation regions 12, the first and second edge regions 31, 32 also have a stripe-like or wall-like geometry. However, implementing the compensation regions 12 and the second edge regions 32 with a stripe-like or wall-like geometry is only an example.

Figure 3:
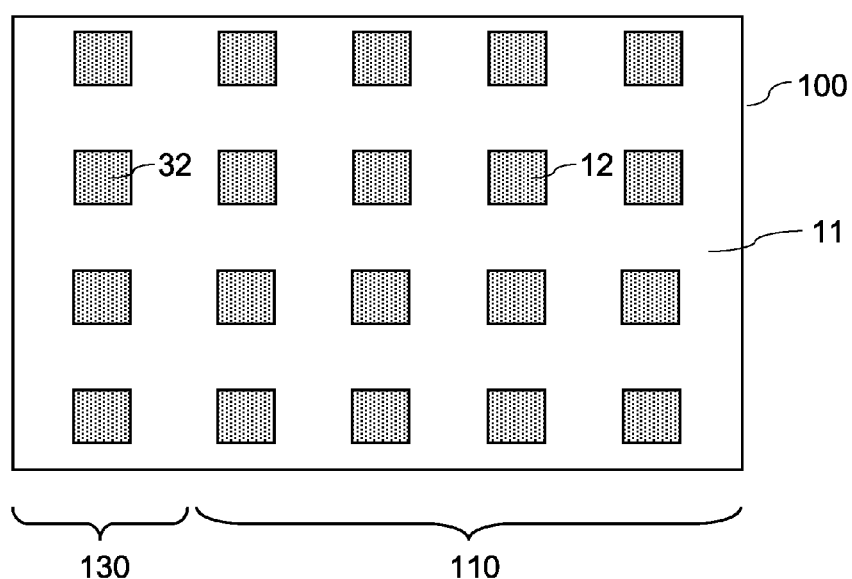
FIG. 3 illustrates a horizontal cross sectional view of a semiconductor body in the first device region according to a further embodiment.

According to a further embodiment illustrated in FIG. 3, the compensation regions 12 could also have a pillar-like geometry, where the individual piles extend in the vertical direction of the semiconductor body 100. FIG. 3 shows a horizontal cross sectional view of the semiconductor body 100 in the first device region 110, in which horizontal cross sections of the individual compensation regions 12 are illustrated. It is also possible, to have pillar-like and elongated compensation in one semiconductor device.

Referring to FIG. 3, which also shows a section of the intermediate region 130, the second edge regions 32 can be pillar-like regions. However, the geometry of the second edge regions 32 can be independent from the geometry of the compensation regions 12. Thus, elongated second edge regions 32 can be combined with pillar-like compensation regions 12, and pillar-like second edge regions 32 can be combined with elongated compensation regions 12. Elongated second edge regions 31 may extend distant and parallel to sidewalls $41_2$ of the well (as illustrated in FIG. 2) or may extend distant and perpendicular to the sidewalls $41_2$ of the well.

Figure 4:
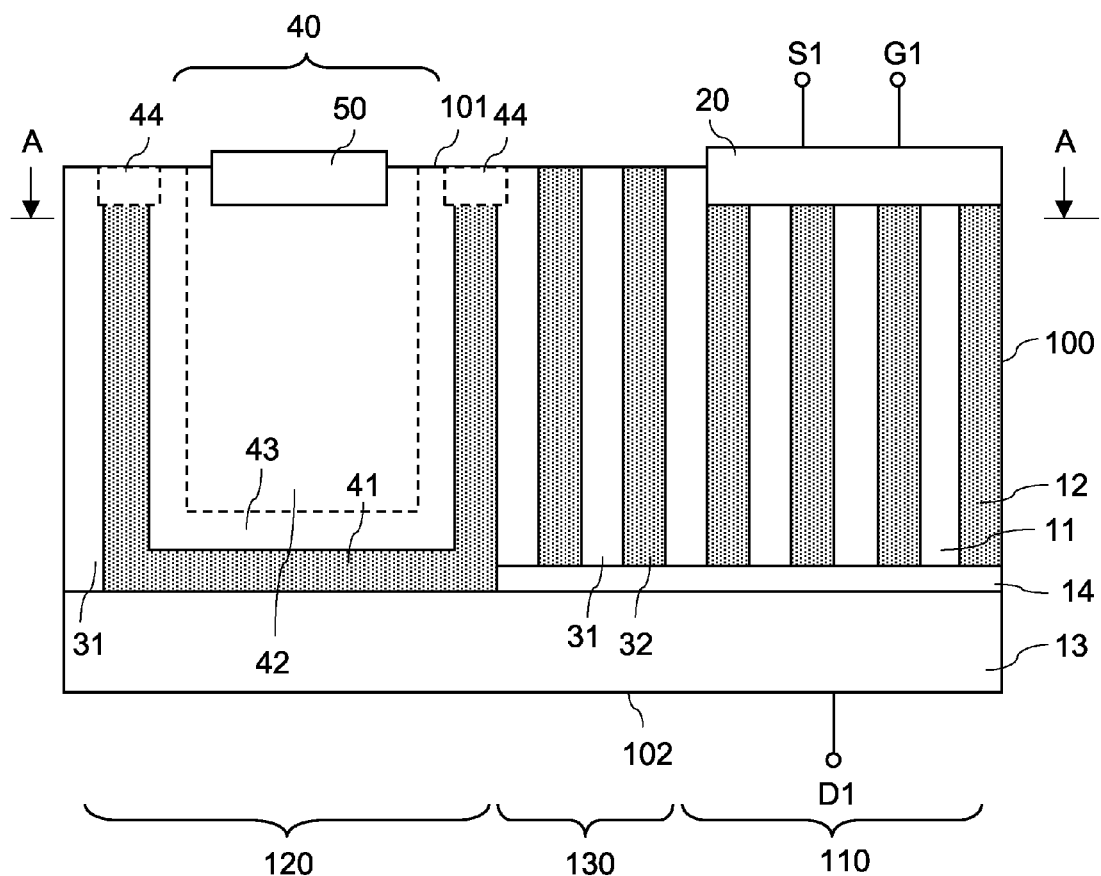
FIG. 4 illustrates a vertical cross sectional view of a semiconductor arrangement according to a further embodiment.

FIG. 4 illustrates a vertical cross sectional view of the semiconductor arrangement according to a further embodiment. In this embodiment, the well 41 adjoins the drain region 13, while the drift regions 11 and the compensation regions 12, as well as the edge regions 31, 32, are separated from the drain regions 13 by the semiconductor region 14. This semiconductor region 14 has the first doping type and a doping concentration that equals the doping concentration of the drift regions 11 or may be slightly lower (such as between 0 and 5% or between 0 and 10% lower) or slightly higher (such as between 0 and 5% or between 0 and 10% higher) than the doping concentration of the drift regions 11. The doping concentration of the semiconductor region 14 may correspond to the basic doping concentration of the epitaxial layer in which it is formed or may be higher than the basic doping. According to one embodiment, the doping concentration of the semiconductor region 14 is about $2 \cdot 10^{15}$ cm$^{-3}$. A length (thickness) of the semiconductor region 14, which is its dimension in the vertical direction of the semiconductor body 100, may correspond to the thickness of one of the epitaxial layers, namely the first epitaxial layer in which the semiconductor region 14 is formed.

The well 41 enclosing or surrounding the first semiconductor region 42 in which the further semiconductor device 50 is implemented, shields or protects the further semiconductor device 50 from electrical potential that may occur in the active semiconductor regions of the power transistor, where the active semiconductor regions of the power transistor are the drain regions 13, the drift regions 11, the compensation regions 12 and source and body regions (not shown in FIGS. 1 and 4) in the control structure 20.

The shielding effect of the well 41 is explained in the following. For explanation purposes, it is assumed that the power transistor is an n-type transistor, in which the drain region 13 and the drift regions 11 are n-type or n-doped regions, while the compensation regions 12 are p-type or p-dope regions. Consequently, the well 41 is p-doped, while the first semiconductor region 42 and the optional second semiconductor region 43 are n-doped. For explanation purposes it is further assumed that a positive voltage is applied between the drain and source terminals D1, S1 of the power transistor when the power transistor is in operation. This voltage is, for example, in the range of several volts, when the power transistor is in an on-state (switched on), and can be up to several hundred volts when the power transistor is in an off-state (switched off). The maximum voltage is dependent on the voltage blocking capability of the power transistor. For explanation purposes it is further assumed that the electrical potential of the well 41 is equal to or below the electrical potential of the drain region 13. The well 41 may be floating or may be connected to the drain terminal D1 or a terminal with a defined electrical potential as explained before. Between the well 41 and the semiconductor regions outside the well 41 and adjoining the well, a pn-junction is formed that is reverse biased, so as to prevent a current from outside coming through the well 41 into the first semiconductor region 42 when the electrical potential outside the well 41 is higher than the electrical potential of the well 41. Semiconductor regions adjoining the well 41 and forming a pn-junction are the drain region 13 or the optional semiconductor region 14 of the first doping type arranged between the drain region 13 and the bottom section $41_1$ of the well (see FIG. 1), and first edge regions 31 adjoining sidewalls $41_2$ of the well 41. Referring to FIGS. 1 and 4, a first edge region 31 of the first doping type adjoins the sidewall $41_2$ of the well 41 also on that side of the well 41 facing away from the power transistor. According to one embodiment, the first edge region 31 adjoining the well on a side facing away from the power transistor adjoins an edge of the semiconductor body 100.

Figure 5:
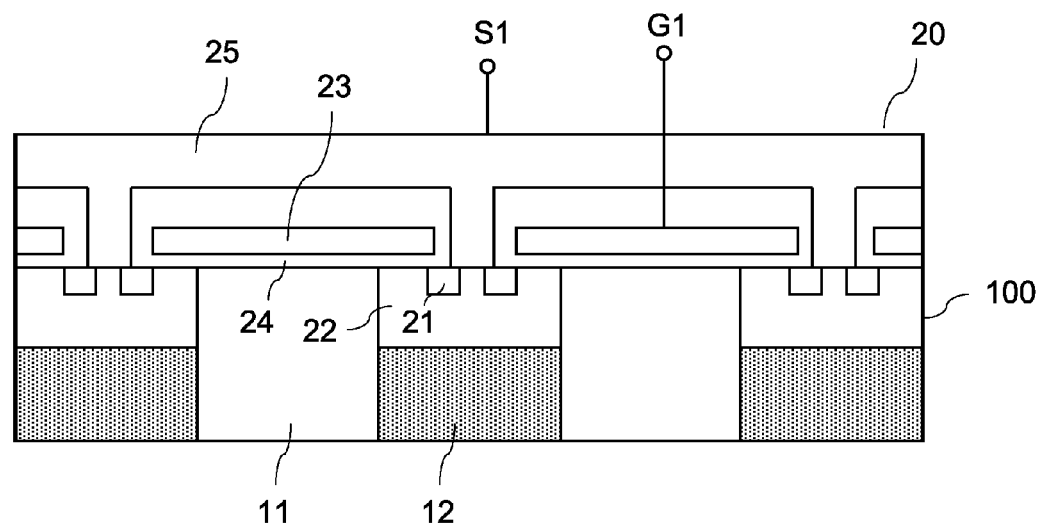
FIG. 5 illustrates a vertical cross sectional view of a control structure of the power transistor according to a first embodiment.

FIG. 5 illustrates a vertical cross sectional view of a section of the control structure 20 of the vertical power transistor according to a first embodiment. Referring to FIG. 5, the control structure 20 includes a plurality of transistor cells which each transistor cell including a source region 21 of the first doping type, which is the doping type of the drift regions 11, and a body region 22 of the second doping type arranged between the source region 21 and one drift region 11. The transistor cells are connected in parallel by having their source regions 21 and their body region 22 electrically connected to a source electrode 25 that forms the source terminal S1 of the power transistor. A gate electrode 23 is arranged adjacent to the body region 22 and is dielectrically insulated from the body region 22 by a gate dielectric 24. The gate electrode 23 can be a continuous electrode or may include several gate electrode sections that are electrically connected with each other. In the embodiment illustrated in FIG. 5, the gate electrode 23 is a planar gate electrode arranged above the first surface 101 of the semiconductor body 100. The compensation regions 12 adjoin the body regions 22 and are, therefore, electrically connected to the source terminal S1.

Figure 6:
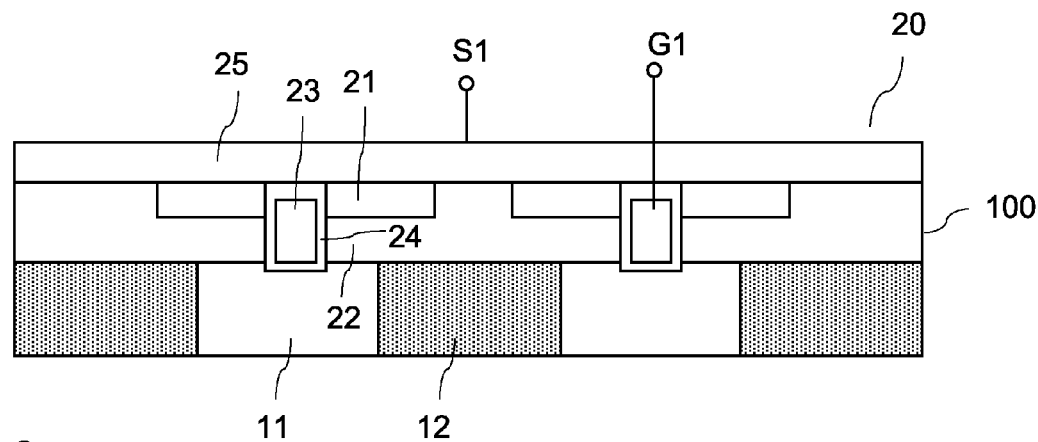
FIG. 6 illustrates a vertical cross sectional view of a control structure of the power transistor according to a second embodiment.

FIG. 6 illustrates a further embodiment of the gate structure. In this embodiment, the gate electrode 23 or the sections of the gate electrode 23 are arranged in trenches extending from the first surface 101 into the semiconductor body 100. Each trench with one gate electrode 23 or one gate electrode section and one gate dielectric 24 extends through the source region 21 and the body region 22 to or into one drift region 11. The compensation regions 12 adjoin the body region 22 which is electrically connected to the source electrode 25 together with the source regions 21.

The individual transistor cells can be implemented as stripe-like transistor cells. The geometry of the transistor cells is mainly defined by the geometry of the source and body regions 21, 22. Stripe-like transistor cells have source regions and body regions 22 extending longitudinally in a direction perpendicular to the section plane illustrated in FIGS. 1 and 6. However, the individual transistor cells could also be implemented as hexagonal transistor cells, or the like.

Figure 7:
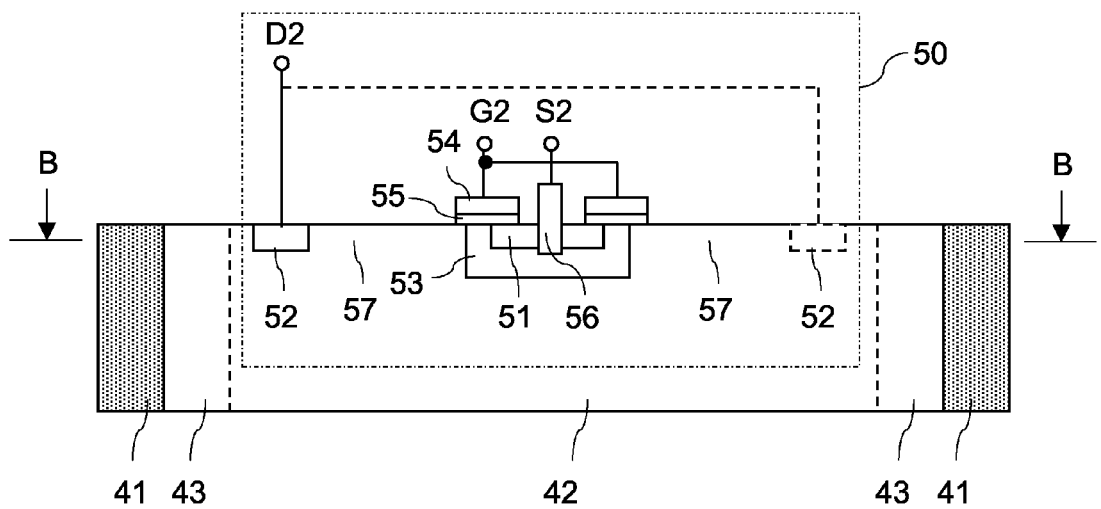
FIG. 7 illustrates a vertical cross sectional view of a further semiconductor device implemented as a lateral transistor according to a first embodiment.

FIG. 7 illustrates a vertical cross sectional view of the further semiconductor device 50 according to a first embodiment. In the embodiment illustrated in FIG. 7, the further semiconductor device 50 is implemented as a lateral high voltage transistor. This lateral power transistor includes a source region 51 and a drain region 52 that are arranged distant to each other in a lateral direction of the semiconductor body 100. The lateral transistor further includes a body region 53 and a drift region 57. The drift region 57 adjoins the drain region 52 and is arranged between the drain region 52 and the body region 53. The body region 53 is arranged between the drift region 57 and the source region 51 and separates the source region 51 from the drift region 57. A gate electrode 54 is arranged adjacent to the body region 53 and is dielectrically insulated from the body region 53 by a gate dielectric 55. The drain region 52 of the lateral transistor is connected to a further drain terminal D2, the gate electrode 54 is connected to a further gate electrode G2, and a source electrode 56 that is electrically connected to the source region 51 and the body region 53 is connected to a further source terminal S2. In the embodiment illustrated in FIG. 7, the drift region 57 is formed by a section of the first semiconductor region 42, so that the drift region 57 has the same doping concentration as the first semiconductor region 42. The doping type of the drain region 52 corresponds to the doping type of the first semiconductor region 42, the doping type of the source region 51 corresponds to the doping type of the first semiconductor region 42, and the body region 53 is doped complementarily. Since the doping type of the first semiconductor region 42 corresponds to the doping type of the drift regions 11 of the power transistor, the conduction type of the lateral transistor corresponds to the conduction type of the power transistor, so that the lateral transistor is an n-type transistor when the power transistor is an n-type transistor, and the lateral transistor is a p-type transistor when the power transistor is a p-type transistor.

The lateral transistor can be implemented as an enhancement transistor. In this case, the body region 53 adjoins the gate dielectric 55, so that an inversion channel has to be generated in the body region 53 in order to switch the lateral transistor on. The lateral transistor could also be implemented as a depletion transistor. In this case, a channel region of the same doping type as the source region 51 and the drift region 57 is arranged between the body region 53 and the gate dielectric 55 and extends from the source region 51 to the drift region 57. This channel region is illustrated in dashed lines in FIG. 7.

According to one embodiment, the body region 53 and the source region 51 are located in the middle between two sections of the drain region 52 that are both connected to the drain terminal D2. In FIG. 7, one of these drain region sections is optional and is therefore drawn in dashed lines. According to another embodiment, the drain region 52 has the shape of a ring that surrounds the drift region 57, and the body region 53 and the source region 51 in the horizontal plane.

Figure 8:
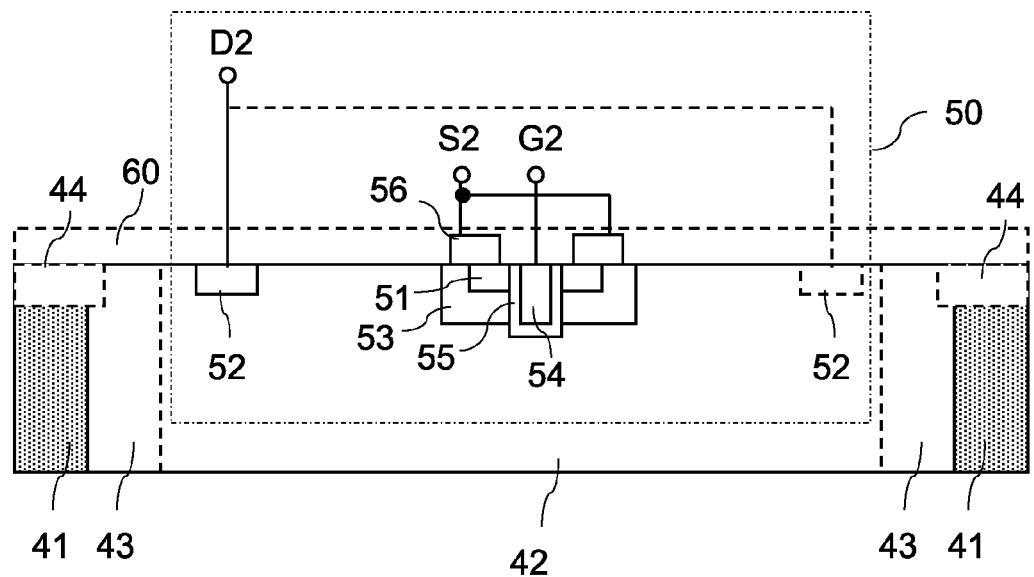
FIG. 8 illustrates a vertical cross sectional view of a further semiconductor device implemented as a lateral transistor according to a second embodiment.

In the lateral transistor according to FIG. 7, the gate electrode 54 is implemented as a planar gate electrode arranged above the first surface 101 of the semiconductor body. However, this is only an example. FIG. 8 illustrates a further embodiment of a lateral power transistor arranged within the well 41. In this embodiment, the gate electrode 54 is implemented as a trench electrode arranged in a trench extending from the first surface 101 through the source region 51 and the body region 53 to or into the drift region 57. The gate electrode 54 is dielectrically insulated from these device regions of the lateral power transistor by a gate dielectric 55.

Figure 9:
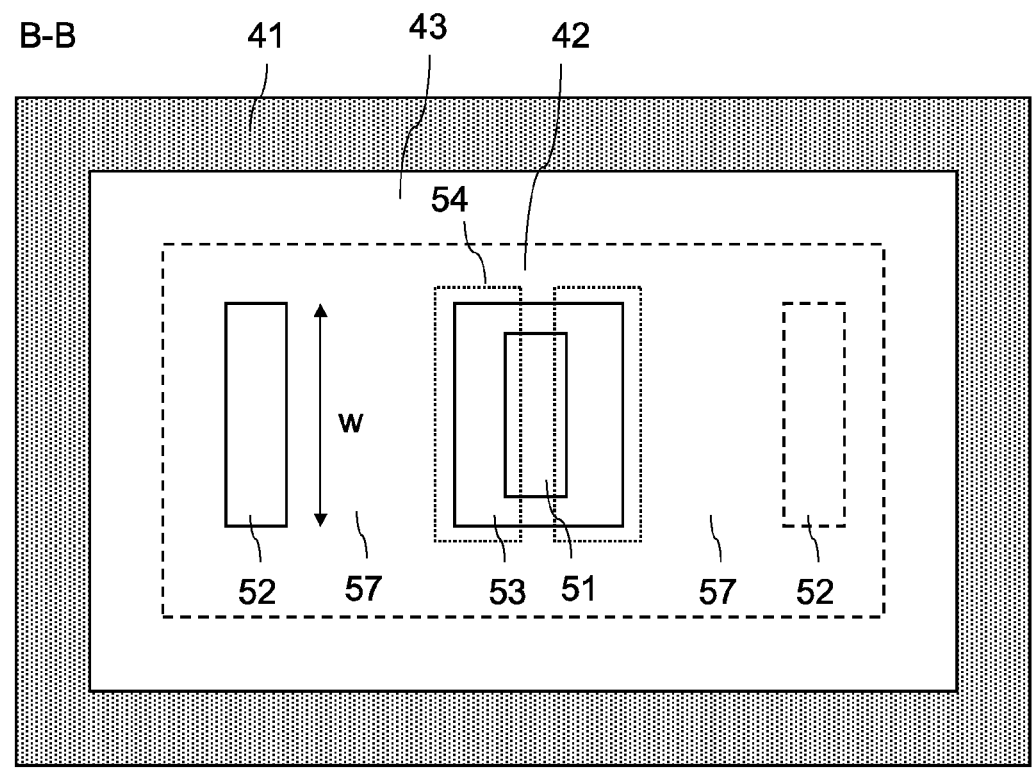
FIG. 9 illustrates a horizontal cross sectional view of a further semiconductor device illustrated in FIG. 7 according to a first embodiment.

FIG. 9 illustrates a horizontal cross sectional view of an embodiment of the further semiconductor device 50 implemented as a lateral power transistor as illustrated in FIG. 7. Referring to FIG. 9, the lateral transistor has a channel width w that is mainly defined by a dimension of the drain region 52 and the source region 51 in a direction perpendicular to a current flow direction in the lateral power transistor.

In the embodiment illustrated in FIG. 9, the drift region 57 of the lateral power transistor has a doping concentration corresponding to the doping concentration of the second semiconductor region 43.

Figure 10:
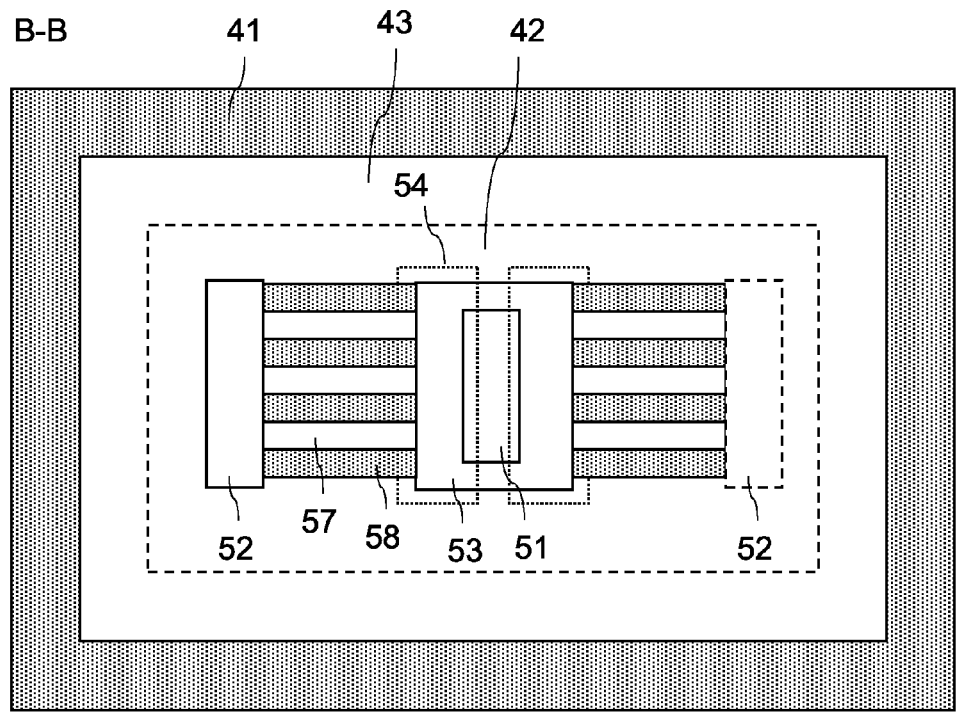
FIG. 10 illustrates a horizontal cross sectional view of a further semiconductor device illustrated in FIG. 7 according to a second embodiment.

FIG. 10 illustrates a horizontal cross sectional view of a lateral power transistor according to a further embodiment. In this embodiment, the lateral power transistor includes several drift regions 57 extending between the drain region 52 and the body region 53 and compensation regions 58 of a doping type complementary to the doping type of the drift regions 57 and adjoining the drift regions 57. The drift regions 57 can have a higher doping concentration than this first semiconductor region 42. The second semiconductor region 43 surrounds the active transistor regions of the lateral power transistor, so that the active transistor regions do not extend to the well 41.

Figure 11:
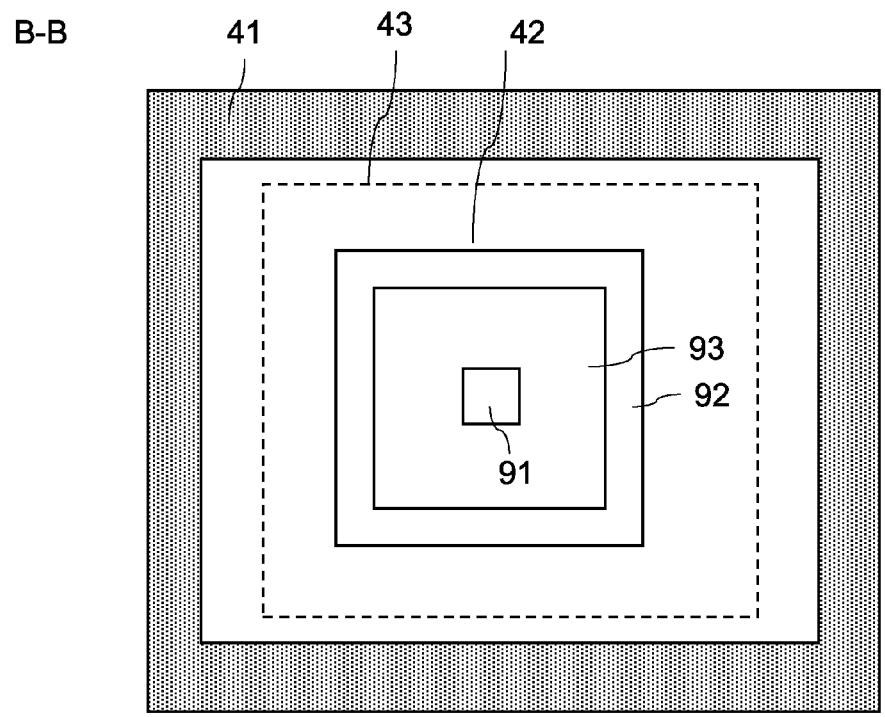
FIG. 11 illustrates a horizontal cross sectional view of a further semiconductor device implemented as a lateral diode.

To implement the semiconductor device in the well 41 as a lateral transistor is only one of a plurality of different possibilities. According to a further embodiment illustrated in FIG. 11, the semiconductor device integrated in the well 41 is a lateral diode with a first emitter region 91, a base region 93, and a second emitter region 92. In the embodiment illustrated in FIG. 11, the second emitter region 92 is ring-shaped and surrounds the base region 93 and the first emitter region 91 in the horizontal plane. The base region 93 and the second emitter region 92 have the same doping type as the second semiconductor region 43, where the second emitter region 92 is higher doped than the second semiconductor region 43. The doping concentration of the base region 93 may correspond to the doping concentration of the second semiconductor region 43.

Figure 12:
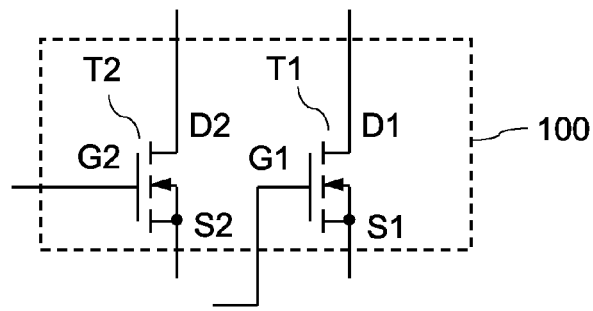
FIG. 12 illustrates an electrical circuit diagram of the power transistor and a further semiconductor device, implemented as a transistor, integrated in the semiconductor body.

FIG. 12 illustrates an electrical circuit diagram of the semiconductor arrangement with the vertical power MOSFET and the lateral power transistor explained before. The circuit diagram includes two transistors, namely a first transistor T1 formed by the vertical power transistor, and a second transistor T2 formed by the lateral power transistor. As illustrated in dashed lines in FIG. 6, these two transistors are integrated in a common semiconductor body 100. There are six terminals available at the semiconductor body 100, namely the drain terminal D1, the source terminal S1 and the gate terminal G1 of the first transistor T1, and the drain terminal D2, the source terminal S2 and the gate terminal G2 of the lateral transistor T2. Just for illustration purposes it is assumed that the two transistors T1, T2 are n-type enhancement transistors.

Figure 13:
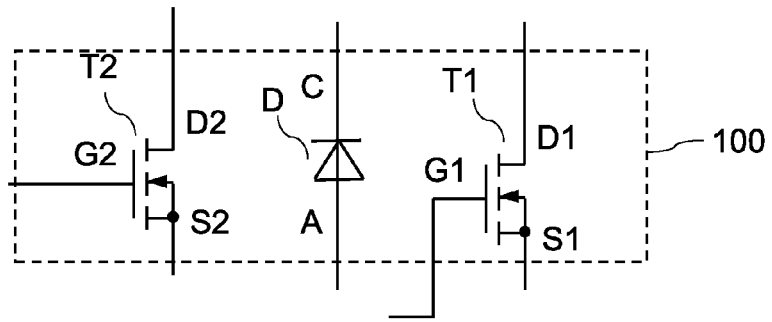
FIG. 13 illustrates an electrical circuit diagram of the power transistor and two further semiconductor device, implemented as a transistor and a diode, integrated in the semiconductor body.

FIG. 13 illustrates an electrical circuit diagram of a semiconductor arrangement with a vertical power MOSFET T1, a lateral power transistor T2, and a lateral power diode D. The power diode can be implemented as explained with reference to FIG. 11. The lateral power transistor T2 and the lateral power diode D can be integrated in one well 41 or each of these devices can be integrated in a separate well 41.

Figure 14:
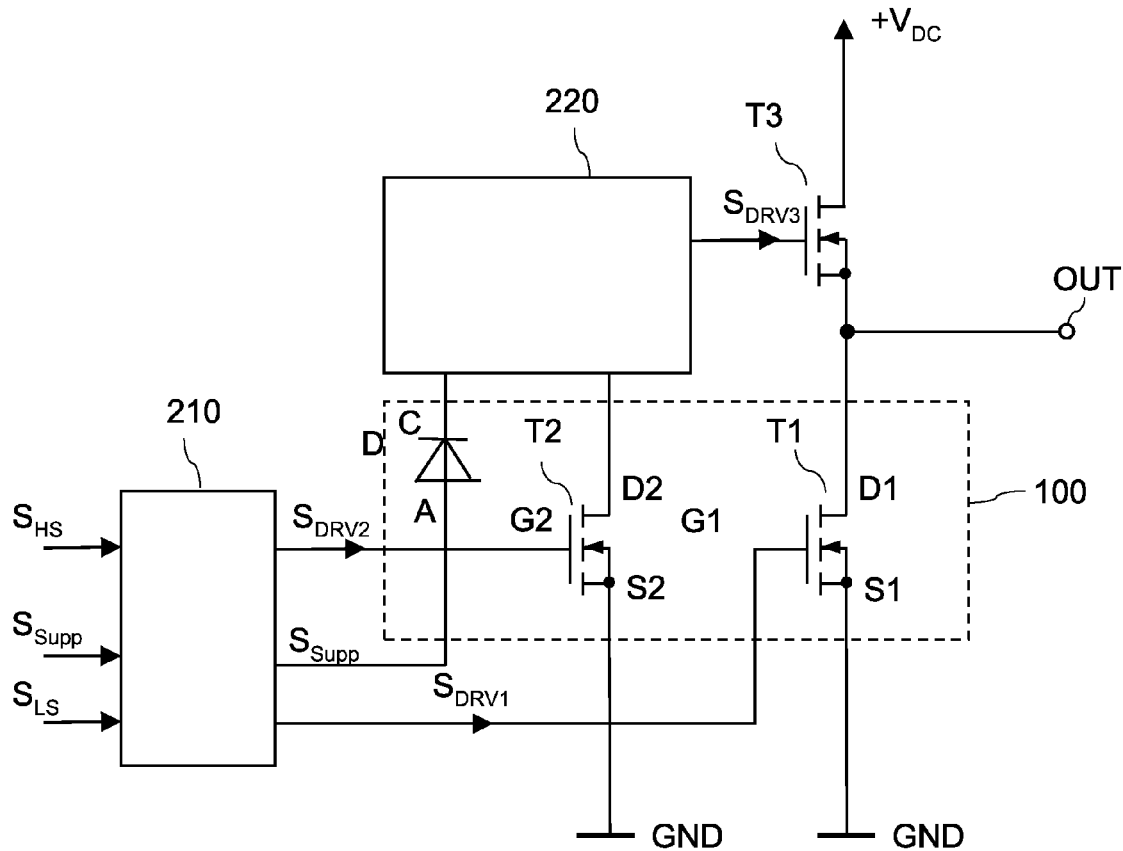
FIG. 14 illustrates an embodiment of a half-bridge circuit including a low-side transistor, a high-side transistor, a high-side drive circuit and a level-shifter transistor.

FIG. 14 illustrates a first embodiment of an application circuit in which the two transistors T1, T2 integrated in the semiconductor body 100 are implemented. The circuit according to FIG. 14 is a half-bridge circuit with a low-side transistor which is formed by the first transistor T1, a high-side transistor T3, and a high-side drive circuit 220 including a level-shifter with a level-shifter transistor. The level-shifter transistor is formed by the second transistor T2. Optionally, the level-shifter includes a boot strap diode that can be implemented by the diode D explained before. In the embodiment illustrated in FIG. 12, the high-side transistor T3 and the low-side transistor T1 are both implemented as n-type enhancement MOSFETs. However, this is only an example. These two transistors could also be implemented as p-type MOSFETs or as complementary MOSFETs. The high-side transistor T3 and the low-side transistor T1 each have a load path that is formed by the drain-source paths of the MOSFETs and a control terminal that is formed by the gate terminal of the individual MOSFETs. In the embodiment illustrated in FIG. 12, the level-shifter transistor T2 is also implemented as an n-type enhancement MOSFET. However, this is only an example. The level-shifter transistor could by implemented as any type of transistor that can be integrated in the further dielectric well 50.

The load paths of the high-side transistor T3 and the low-side transistor T1 are connected in series between terminals for a positive supply potential $+V_{DC}$ and a negative supply potential or a reference potential GND, respectively. A circuit node that is common to load paths of the high-side transistor T3 and the low-side transistor T1 forms an output OUT of the half-bridge circuit.

The half-bridge circuit further includes a control circuit 210 that receives a first input signal $S_{LS}$ and a second input signal $S_{HS}$. The first input signal $S_{LS}$ defines a desired switching state of the low-side switch T1, and the second input signal $S_{HS}$ defines a desired switching state of the high-side transistor T3. The control circuit 210 is configured to generate a first drive signal $S_{DRV1}$ from the first input signal $S_{LS}$ and a second drive signal $S_{DRV2}$ from the second input signal $S_{HS}$. Alternatively and not shown in FIG. 11 the first drive signal $S_{DRV1}$ and the second drive signal $S_{DRV2}$ may be generated out of only one single input signal, for example by using the inverted input signal and adding certain delay times to prevent low-side switch T1 and high-side switch T3 to be in conduction mode at the same time. While the first drive signal $S_{DRV1}$ is directly received at the gate terminal of the low side transistor T1, a level-shifting of the signal level of the second drive signal $S_{DRV2}$ is required in order to drive the high-side transistor T3. The first and second drive signals $S_{DRV1}$, $S_{DRV2}$ may be signals that are referenced to the reference potential GND. While the low-side transistor T1 can be switched on an off using the first drive signal $S_{DRV1}$ referenced to the reference potential GND, a third drive signal $S_{DRV3}$ that is referenced to the electrical potential at the output terminal OUT of the half-bridge circuit is required for switching on and off the high-side transistor T3. This drive signal $S_{DRV3}$ is generated by the high-side drive circuit 220 using the level-shifter transistor T2 that is connected between the high-side drive circuit 220 and the reference potential GND. The level-shifter transistor T2 receives the second drive signal $S_{DRV2}$. The high-side drive circuit 220 is configured to evaluate a switching state of a level-shifter transistor T2 and to generate the third drive signal $S_{DRV3}$ dependent on the detected switching state of the level-shifter transistor T2. When, for example, the level-shifter transistor T2 is switched on through the second drive signal $S_{DRV2}$ the high-side drive circuit 220 generates the third drive signal $S_{DRV3}$ so as to switch on the high-side transistor T3. The voltage blocking capability of the level-shifter transistor T2 is about the voltage blocking capability of the low-side transistor T1, because dependent on the switching state of the half-bridge circuit, the voltage across the load path of the level-shifter transistor T2 is about the same as the voltage across the load path of the low-side transistor T1.

Diode D may, for example, be used as a bootstrap diode to generate a supply voltage of the high-side drive circuit 220 from the supply voltage $S_{Supp}$ of the low-side drive circuit 210. When transistor T1 is in the on-state, the reference potential of the high-side drive circuit 220 and of the high-side transistor T3 is close to the reference potential GND. Lateral power diode D therefore may be in forward operation and charging an energy storage (see, e.g., capacitive storage element 222 in FIG. 11) of high-side driving circuit 220. When transistor T1 is in off-state, the reference potential of the high-side drive circuit 220 and of the high-side transistor T3 is close to the positive supply potential $+V_{DC}$, for example. In this operation state, the lateral diode D prevents the energy storage of the high-side circuit 220 from being discharged and thus ensures the operation of high-side circuit 220.

Figure 15:
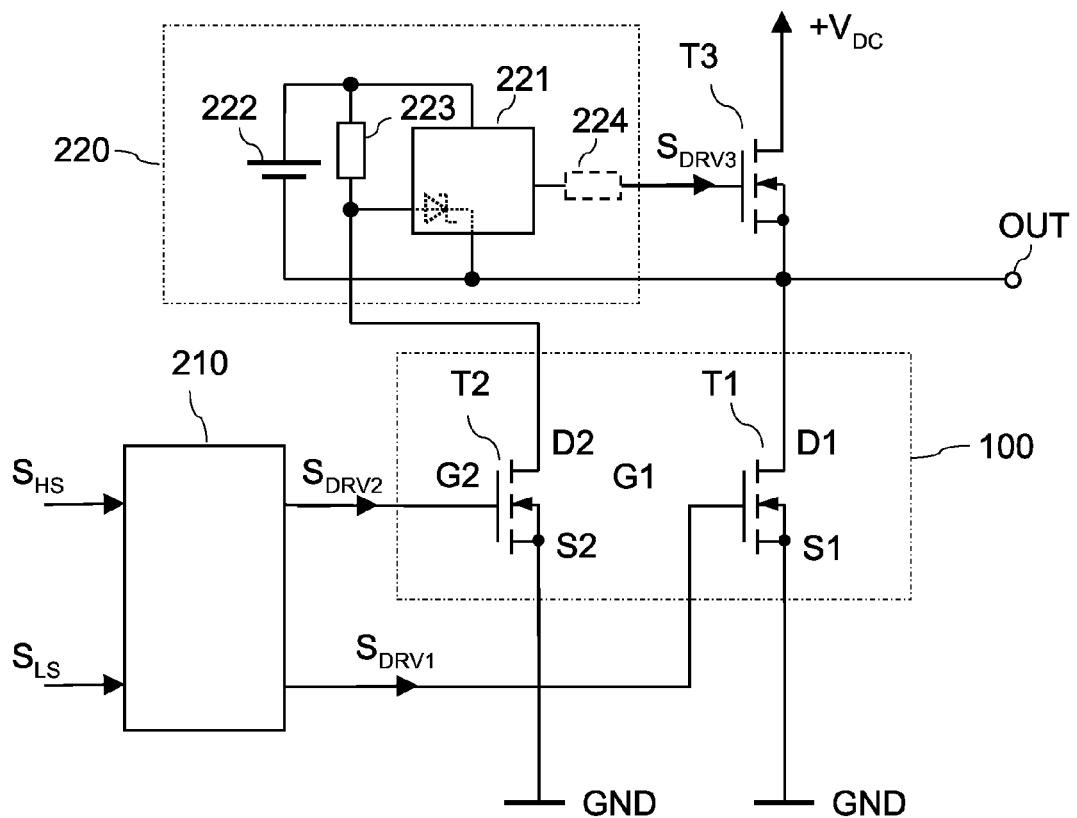
FIG. 15 illustrates the half-bridge circuit of FIG. 14 wherein one embodiment of the high-side drive circuit is illustrated in detail.

FIG. 15 illustrates the half-bridge circuit according to FIG. 14, wherein an embodiment of the high-side drive circuit 220 is illustrated in greater detail. In this embodiment, the high-side drive circuit 220 includes a drive unit 221 with supply terminals connected to a voltage source 222, an output terminal coupled to the gate terminal of the high-side transistor T3, and an input terminal. Optionally, a gate resistor 224 is connected between the output of the drive unit 221 and the gate terminal of the high-side transistor T3. In the specific embodiment of FIG. 15, the voltage source 222 is implemented as an energy storage element, such as a capacitor. A first one of the supply terminals of the drive unit 221 is connected to a positive supply terminal of the voltage source 222, while a second supply terminal is connected to a negative supply terminal of the voltage source 222 and to the output OUT of the half-bridge circuit. Thus, the electrical potential at the first supply terminal of the drive unit 221 corresponds to the electrical potential of the output terminal OUT plus the supply voltage provided by the voltage source 222.

The voltage source 222 may also be a voltage source other than an energy storage element supplied by a bootstrap diode. In this case, the bootstrap diode D can be omitted or can be used for other purposes in the circuit.

An impedance 223, such as a resistor, is connected between the first supply terminal and the input terminal of the drive unit 221 and is connected in series with the load path of the level-shifter transistor T2, where the series circuit with the impedance 223 and the level-shifter transistor T2 is connected between the positive supply terminal of the voltage source 222 and reference potential GND. The drive unit 221 is configured to evaluate a voltage across the impedance 223 and to generate the third drive signal $S_{DRV3}$ dependent on the detected voltage across the impedance 223, where this voltage is dependent on the switching state of the level-shifter transistor T2. Alternatively and not shown in FIG. 11, an additional impedance may be placed between impedance 223 and terminal D2 of the level-shifter transistor T2 to reduce e.g. current values and power losses.

The operating principle of the half-bridge circuit according to FIG. 15 is now explained. For explanation purposes it is assumed that both, the low-side transistor T1 and the high-side transistor T3 are switched off and that in a next step switching on of the high-side transistor T3 is desired. It is further assumed, that the electrical potential at the output OUT is somewhere between the reference potential GND and the positive supply potential $+V_{DC}$. This potential at the output OUT is dependent on the characteristic of a load (not illustrated) connected to the output OUT and may, e.g. during turn-off of transistor T1 even exceed the positive supply potential $+V_{DC}$. Just for explanation purposes it is assumed that the electrical potential at the output OUT is about 50% of the positive supply potential $+V_{DC}$. The supply potential $+V_{DC}$ is, for example, in the range of between 300V and 600V.

When the level-shifter transistor T2 is switched off, the voltage across the impedance 223 is zero, and the voltage across the level-shifter transistor T2 corresponds to the electrical potential at the output OUT plus the supply voltage of the voltage source 222. Thus, a voltage blocking capability of the level-shifter transistor T2 is required that is at least the voltage blocking capability of the low-side transistor T1.

When the second drive signal $S_{DRV2}$ switches the level-shifter transistor T2 on, a current flows through the impedance 223, so that the voltage across the impedance 223 increases, where the electrical potential and the input of the drive unit 223 may even fall below the electrical potential at the output terminal OUT. According to one embodiment, the drive unit 221 includes a protection circuit that prevents the electrical potential at the input of the drive unit 221 to significantly drop below the electrical potential at the output OUT. According to one embodiment, a diode or an Avalanche or Zener diode (illustrated in dotted lines) or an arrangement with a plurality of diodes and/or Avalanche or Zener diodes connected in series can be connected between the second supply terminal and the input terminal. The drive unit 221 may either evaluate the voltage across the impendence 223 or may detect a decrease of the electrical potential at the input terminal to below the electrical potential at the output OUT, which is the electrical potential at the second supply terminal of the drive unit 221. According to one embodiment, the drive unit 221 generates a signal level of the drive signal $S_{DRV3}$ that switches the high-side transistor T3 on when the electrical potential at the input terminal of the drive unit 221 falls below the electrical potential at the second supply terminal of the drive unit 221.

Besides a high voltage blocking capability, the level-shifter transistor T2 may also have a high on-resistance, so as to prevent the level-shifter transistor T2 from discharging the voltage source 222 and from changing the electrical potential at the output terminal OUT.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor arrangement, comprising:
    a semiconductor body;
    a power transistor arranged in a first device region of the semiconductor body and comprising at least one source region, a drain region, and at least one body region, at least one drift region of a first doping type and at least one compensation region of a second doping complementary to the first doping type, and a gate electrode arranged adjacent to the at least one body region and dielectrically insulated from the body region by a gate dielectric; and
    a further semiconductor device arranged in a second device region of the semiconductor body, the second device region comprising a well-like structure of the second doping type surrounding a first semiconductor region of the first doping type, the further semiconductor device comprising device regions arranged in the first semiconductor region, wherein the further semiconductor device is completely within the well-like structure and wherein the power transistor is completely outside of the well-like structure.

2. The semiconductor arrangement of claim 1, further comprising a second semiconductor region of the first doping type having a higher doping concentration than the first semiconductor region and arranged between the well-like structure and the first semiconductor region.

3. The semiconductor arrangement of claim 2, wherein the well-like structure comprises a bottom section and sidewall sections, and wherein the second semiconductor region is only arranged between the bottom section of the well-like structure and the first semiconductor region.

4. The semiconductor arrangement of claim 1, wherein the second device region is arranged distant to the first device region in a lateral direction of the semiconductor body.

5. The semiconductor arrangement of claim 4, wherein an edge region is arranged between the first device region and the second device region, the edge region comprising a plurality of first edge regions of the first doping type extending in a vertical direction of the semiconductor body and a plurality of second edge regions of the second doping type extending in a vertical direction of the semiconductor body, each first edge region adjoining at least one second edge region.

6. The semiconductor arrangement of claim 1, wherein the semiconductor body comprises a first surface, and wherein the well-like structure extends to the first surface and comprises in the region of the first surface a section doped higher than remaining sections of the well-like structure.

7. The semiconductor arrangement of claim 1, wherein the power transistor comprises a plurality of transistors cells each comprising a source region, a body region, a drift region and a compensation region and having the drain region in common.

8. The semiconductor arrangement of claim 1, wherein the semiconductor body further comprises:
    a first semiconductor layer forming the drain region; and
    a second semiconductor layer arranged above the first semiconductor layer, the second semiconductor layer comprising the second device region and the at least one drift region, the at least one compensation region, the at least one source region and the at least one body region of the power transistor.

9. The semiconductor arrangement of claim 1, wherein the further semiconductor device is implemented as a lateral power transistor.

10. The semiconductor arrangement of claim 9, wherein the lateral power transistor comprises:
    a further source region and a further drain region arranged in the first semiconductor region and distant in a lateral direction of the semiconductor body;
    at least one further drift region and a further body region, wherein the further body region is arranged between the further source region and the at least one further drift region, and the at least one further drift region is arranged between the further body region and the further drain region; and
    a further gate electrode arranged adjacent to the further body region and dielectrically insulated from the further body region by a further gate dielectric.

11. The semiconductor arrangement of claim 10, wherein a part of the first semiconductor region forms the at least one further drift region.

12. The semiconductor arrangement of claim 10, wherein the lateral power transistor further comprises at least one compensation region of a doping type complementary to the doping type of the at least one drift region and adjoining the at least one drift region.

13. The semiconductor arrangement of claim 12, wherein the at least one compensation region of the lateral power transistor is connected to the further body region or the further source region.

14. The semiconductor arrangement of claim 12, wherein the at least one further drift region is of the same doping type as the first semiconductor region and has a higher doping concentration.

15. The semiconductor arrangement of claim 10, wherein the further device region is arranged between the first device region and an edge of the semiconductor body, wherein the further drain region is arranged closer to the edge of the semiconductor body than the further source region.

16. A semiconductor arrangement, comprising:
a semiconductor body;
a power transistor arranged in a first device region of the semiconductor body and comprising at least one source region, a drain region, and at least one body region, at least one drift region of a first doping type and at least one compensation region of a second doping complementary to the first doping type, and a gate electrode arranged adjacent to the at least one body region and dielectrically insulated from the body region by a gate dielectric;
a further semiconductor device arranged in a second device region of the semiconductor body, the second device region comprising a well-like structure of the second doping type surrounding a first semiconductor region of the first doping type, the further semiconductor device comprising device regions arranged in the first semiconductor region; and
a second semiconductor region of the first doping type having a higher doping concentration than the first semiconductor region and arranged between the well-like structure and the first semiconductor region.

17. The semiconductor arrangement of claim 16, wherein the well-like structure comprises a bottom section and sidewall sections, and wherein the second semiconductor region is only arranged between the bottom section of the well-like structure and the first semiconductor region.

18. The semiconductor arrangement of claim 16, wherein the second device region is arranged distant to the first device region in a lateral direction of the semiconductor body.

19. The semiconductor arrangement of claim 18, wherein an edge region is arranged between the first device region and the second device region, the edge region comprising a plurality of first edge regions of the first doping type extending in a vertical direction of the semiconductor body and a plurality of second edge regions of the second doping type extending in a vertical direction of the semiconductor body, each first edge region adjoining at least one second edge region.

20. The semiconductor arrangement of claim 16, wherein the semiconductor body comprises a first surface, and wherein the well-like structure extends to the first surface and comprises in the region of the first surface a section doped higher than remaining sections of the well-like structure.

* * * * *